United States Patent
Bowman

(10) Patent No.: US 8,294,453 B2
(45) Date of Patent: Oct. 23, 2012

(54) EXTERNALLY REPORTING BRANCH POWER MONITORING SYSTEM

(75) Inventor: Marc Bowman, McMinnville, OR (US)

(73) Assignee: Veris Industries, LLC, Portland, OR (US)

( * ) Notice: Subject to any disclaimer, the term of this patent is extended or adjusted under 35 U.S.C. 154(b) by 164 days.

(21) Appl. No.: 12/768,875

(22) Filed: Apr. 28, 2010

(65) Prior Publication Data
US 2010/0295540 A1 Nov. 25, 2010

Related U.S. Application Data

(60) Provisional application No. 61/216,894, filed on May 21, 2009.

(51) Int. Cl.
*G01R 15/18* (2006.01)
*G01R 1/20* (2006.01)

(52) U.S. Cl. .......................... 324/127; 324/126; 324/142

(58) Field of Classification Search .................. None
See application file for complete search history.

(56) References Cited

U.S. PATENT DOCUMENTS

| | | | | |
|---|---|---|---|---|
| 4,096,436 | A * | 6/1978 | Cook et al. ................. | 324/142 |
| 5,384,712 | A * | 1/1995 | Oravetz et al. ............. | 702/62 |
| 6,809,509 | B2 * | 10/2004 | Bruno et al. ............... | 324/157 |
| 6,825,771 | B2 * | 11/2004 | Bruno et al. ............... | 340/638 |
| 6,937,003 | B2 * | 8/2005 | Bowman et al. ........... | 324/117 R |
| 7,312,964 | B2 * | 12/2007 | Tchernobrivets .......... | 361/42 |

* cited by examiner

*Primary Examiner* — Vinh Nguyen
(74) *Attorney, Agent, or Firm* — Chernoff Villhauer McClung & Stenzel, LLP

(57) ABSTRACT

A power monitoring system that reduces the need for external power calculation devices while simplifying the configuration of power meters.

6 Claims, 7 Drawing Sheets

EXTERNALLY REPORTING BRANCH POWER MONITORING SYSTEM

CROSS-REFERENCE TO RELATED APPLICATIONS

This application claims the benefit of U.S. Provisional App. No. 61/216,894, filed May 21, 2009.

BACKGROUND OF THE INVENTION

The present invention relates to a branch current monitoring system.

Referring to FIG. 1, many electrical power distribution systems include a panel enclosure 10 into which is provided electrical power using one or more sets of wires 12. The electrical power may have any voltage, any current, and any number of phases (e.g., single phase, two phases, or three phases). Each phase of the electrical power to the power panel is normally provided to a separate bus bar 14a, 14b, and 14c, which are normally elongate conductors within the power panel 10. A plurality of circuit breakers 16a, 16b, and 16c, etc., which trip or otherwise selectively disconnect electrical power, are electrically interconnected between one or more of the bus bars 14a, 14b, and 14c, and respective loads 18 external to the power panel 10. In many power panels 10 the circuit breakers 16 are vertically aligned in one or more strips. When the load 18 interconnected to a respective circuit breaker 16 within the power panel 10 draws excessive electrical current then the circuit breaker 16 trips or otherwise disconnects the electrical power to the load 18. In this manner, if a load shorts and thereafter draws excessive current then the circuit breaker will trip. Frequently the load will be a three-phase load having three wires provided thereto, with one or more corresponding circuit breakers. Otherwise, the loads are typically single phase or two phase.

In many business environments a set of electrical loads, such as motors, lighting, heating units, cooling units, machinery, etc., may be electrically interconnected to one or more circuits, each of which may be a single phase or multi-phase. Obtaining the total power usage of the business may be readily obtained by reading the power meter provided by the power utility. The power meter is normally electrically interconnected between the power panel and the power utility. In many circumstances, it is desirable to monitor the power consumption of individual loads or groups of loads. The use of power meters permits effective monitoring of the power consumption of particular loads. Also, a set of power meters permits effective sub-metering of different loads, buildings, or groups of loads to attribute and monitor the power usage of the business. For example, the power sub-metering may be used to attribute the power costs charged by the utility to different buildings, departments, or cost centers. The traditional approach to monitoring such power usage is to install a power meter at a location proximate the load itself. To install a typical power meter on a three phase load, a current sensor is located around each wire of the three phases and a voltage connection is electrically interconnected to each wire. Such a power meter is available from Veris Industries, LLC under the name H8035 Power Meter. Unfortunately, it is burdensome to interconnect a significant number of power meters and in particular the voltage connections to the wires, especially if an interconnection to the wires are not readily available. In addition, it is burdensome to interconnect the output of the power meters, if any, to a computer network because of the need to provide communication wiring or other wireless communication channels to each of the remotely located power meters. Also, installing the power meters requires significant expense for the technician to locate a suitable location near each device, in addition to the further expense of servicing the installed power meters.

Referring to FIG. 2, to monitor the power provided to a particular load from one or more individual circuit breakers 16 a respective current sensor 20 may be interconnected to the wire on the load side of the respective circuit breaker 16. Typical circuit breakers may include a single phase, two phases, or three phases. The outputs 22 of each of the current sensors 20 may be interconnected to a power monitor 24. The current sensors 20 may be interconnected to one or more power monitors. Also, the current sensors 20 may likewise be daisy chained together, or interconnected to the power monitor(s) in any other suitable manner. An electrical interconnection from each bus bar to the power monitor(s) normally includes wires 23a, 23b, 23c to sense the voltage and its corresponding phase relationship. Alternatively, the voltage potential and phase relationship for each phase may be sensed from locations other than the bus bars 14a, 14b, and 14c, such as for example, a wire provided to a load, the load side of a circuit breaker, the utility side of a circuit breaker, a capacitive coupling to the voltage potential, or the wire connection from the utility. It is to be understood that the power monitor may calculate power based upon a single phase, two phases, and/or three phases, etc., as desired. In essence, the power monitoring system may use the electrical path from the power monitor 24 to the bus bars (or otherwise) of at least one of the phases for a plurality of different loads. Typically, the power is calculated by multiplying the voltage, corresponding current, and corresponding power factor which relates to the phase relationship between the voltage and current.

It takes considerable time to install, at significant expense, all of the current sensors 20 and the available space within the power panel 10 may be insufficient for the desired number of current sensors. Also, the limited space available along the circuit breakers 16 may result in significant difficulty installing the current sensors 20, thus requiring lateral spacing of the current sensors and bending the wires from the circuit breakers to different locations within the power panel 10 in an attempt to locate sufficient available space for the current sensors 20. In addition, the large number of wires 22 from the current sensors 20 to the power monitor 24 may require considerable space within the power panel 10. Further, because of the significant number of individual wires 22 an installer has a significant tendency to interconnect the wires 22 to improper places within the power current monitor 24 and in particular to mismatch pairs of wires 22 from the same current sensor 20 rending the current sensors 20 ineffective. Moreover, it is problematic to ensure that the wires 22 indicated by the installer that relate to a particular current sensor 20 actually are interconnected to the desired current sensor 20. In summary, the potential installation problems are significant, especially when install by untrained technicians.

Referring to FIG. 3, a set of sensors 60 may be supported by a support 62 which maintains the current sensors 60 in a fixed spatial relationship with respect to one another. Preferably the support 62 is rigid or semi-rigid, while a flexible support 62 that was installed on a rigid or a semi-rigid supporting member(s) may likewise be used. The sensors 60 are preferably current sensors, or alternatively, other types of sensors may be used. The sensors 60 are preferably wire wound torodial coils on a metallic or non-metallic core enclosed within a plastic housing through which a wire 63 may be extended, and the housings are at least partially surrounding the respective coil. Changing current within the wire 63 induces a changing magnetic field around the wire 63. The changing magnetic field in turn induces a changing current within the wire wound torodial coil. The changing current within the torodial coil may be used directly or converted to any suitable signal, such as for example, a voltage signal, or a different current signal.

The openings 64 defined by the sensors 60 are preferably oriented in a substantially parallel relationship with respect to each other and/or oriented in a substantially perpendicular relationship with respect to the longitudinal axis 66 of the support 62 or otherwise the general alignment of the sensors. Preferably, one set of the aligned sensors have a first linear arrangement and another set of the aligned sensors have a second linear arrangement, which may be parallel to each other. Also, preferably at least two of the aligned sensors have a first linear arrangement and at least two others of the aligned sensors have a second linear arrangement. A single aligned set of sensors 60 may be used or more than two sets of sensors 60 may be used, as desired.

Referring also to FIG. 4, the sensors 60 may be arranged such that the housings surrounding the current sensors have an overlapping region 70 in a substantially perpendicular direction with respect to the longitudinal axis of the support 62 and/or general alignment of the sensors. Preferably, the openings 64 defined by the sensors 60 are in a non-overlapping relationship 72 with respect to one another and a non-overlapping relationship 74 with respect to other housings. This permits the sensors to be arranged in a more compact arrangement within the power panel.

Referring also to FIG. 5, a respective transient voltage suppressor 80 may be interconnected in parallel across the output terminals of each sensor 60. The transient voltage suppressors 80 limits the voltage build up at the terminals of the sensors 60, which may occur if the sensors are sensing a changing magnetic field while the terminals of the sensors 60 are open circuited. This decreases the likelihood that technicians will be the recipient of an unanticipated electrical shock.

Referring to FIG. 6, the current sensors 60 are preferably arranged in a spatial arrangement such that the openings 64 defined by the current sensors 60 are in a substantially directly opposing relationship with respect to the circuit breakers 16. In other words, the each of the openings 64 is opposing a respective circuit breaker 16. In this manner, the wires from the circuit breakers 16 may be readily routed through a respective sensor 60.

Referring to FIG. 7, during normal installation the support 62 is initially affixed within the power panel in an adjacent spaced apart relationship with respect to a set of circuit breakers 16. A support may be located on both sides of a set of circuit breakers 16, if desired. Another support more suitable for the right hand side of the circuit breakers may also be used. Then, the wires from the loads are passed through the respective sensors and interconnected to a respective circuit breaker 16. In addition, the wires 23a, 23b, and 23c, for sensing the voltage potentials on the bus bars are likewise electrically interconnected. In this manner, the installation of the circuit breakers and the power monitor is efficient, less expensive, economical, and the sensors are in a suitable position with respect to the respective circuit breakers. The support 62 may be suitable for supporting a set of electrical traces that interconnect the sensors 60 to a connector 82. A cable 84 interconnects each connector 82 to a power monitor 24. While such a set of supports 62 with respective sensors 60 are suitable for use with new installation, it is difficult to install such a set of sensors 60 to an existing set of circuit breakers with wires already installed. To permit the sensors 60 to be readily interconnected with wires already interconnected to the circuit breakers 16 the sensors 60 may be constructed in a split-core manner. In this manner, the opening 64 may be opened, the wire inserted therein, and the opening 64 closed around substantially all of the wire.

To provide effective monitoring of the power usage used by the loads, the power monitor 24 may monitor the current levels of each of circuit breakers 16 together with the associated voltage potential and phase relationship.

The power monitor 24 may likewise be used to monitor the load balance between the different phases of the power panel 10. Frequently, the circuit breakers may be interconnected to a single phase when the loads require 120 volts, interconnected to two phases when the loads require 240 volts, and interconnected to three phases when the loads require three phase power. For example, the first phase of the power panel 10 may be supplying 70 amps, the second phase of the power panel 10 may be supplying 30 amps, and the third phase of the power panel 10 may be supplying 150 amps. This significant imbalance in the current supplied by the different phases is sub-optimal. For example, the greater the current levels the greater the voltage drop from the power source to the power panel, which may result in significant variations in the voltage levels provided to the power panel from the three phase power source. By monitoring the current (or power) provided from each phase using the sensors, the loads may be redistributed between the different phases to re-balance the loads.

What is desired, therefore, is an effective power monitoring system.

DETAILED DESCRIPTION OF THE PREFERRED EMBODIMENT

As a general matter, some existing panels are configured such that the system is configured to determine the single phase power for each respective current sensor for the entire panel. Similarly, some existing panels are configured such that the system is configured to determine the three phase power for each respective contiguous group of three sensors for the entire panel. Likewise, some existing panels are configured such that the system is configured to determine the two phase power for each respective contiguous group of two sensors for the entire panel. However, if the power panel has a mixture of single phase, two phase and/or three phase, Upon reflection of the existing systems, the determination of three phase power requires the selection of three different current sensors, the selection of the corresponding voltage signals, the correlation of the current signals with the respective voltage signals, and subsequent calculation of the three phase power. The determination of two phase power requires the selection of two different current sensors, the selection of the corresponding voltage signals, the correlation of the current signals with the respective voltage signals, and subsequent calculation of the two phase power. The determination of single phase power requires the selection of a current sensor, the selection of the corresponding voltage signal, the correlation of the current signal with the voltage signal, and subsequent calculation of the single phase power.

Accordingly, in the event that a power panel includes a mixture of single phase, two phase, and/or three phase power, then the installer is left with measuring the power associated with each current transformer, then sending the data to an external general purpose computer to the power panel. The general purpose computer, in turn, based upon configuration information determines the power associates with the single phase, two phase, and three phase circuits. It is burdensome to route data cables from a power panel to a general purpose computer to do such calculations, and likewise maintain both the power panel and the general purpose computer. Moreover, electricians which are the primary installers of power panels and the electrical components contained therein and generally ill equipped to configure, install, and support an associated general purpose computer.

Figure 1:
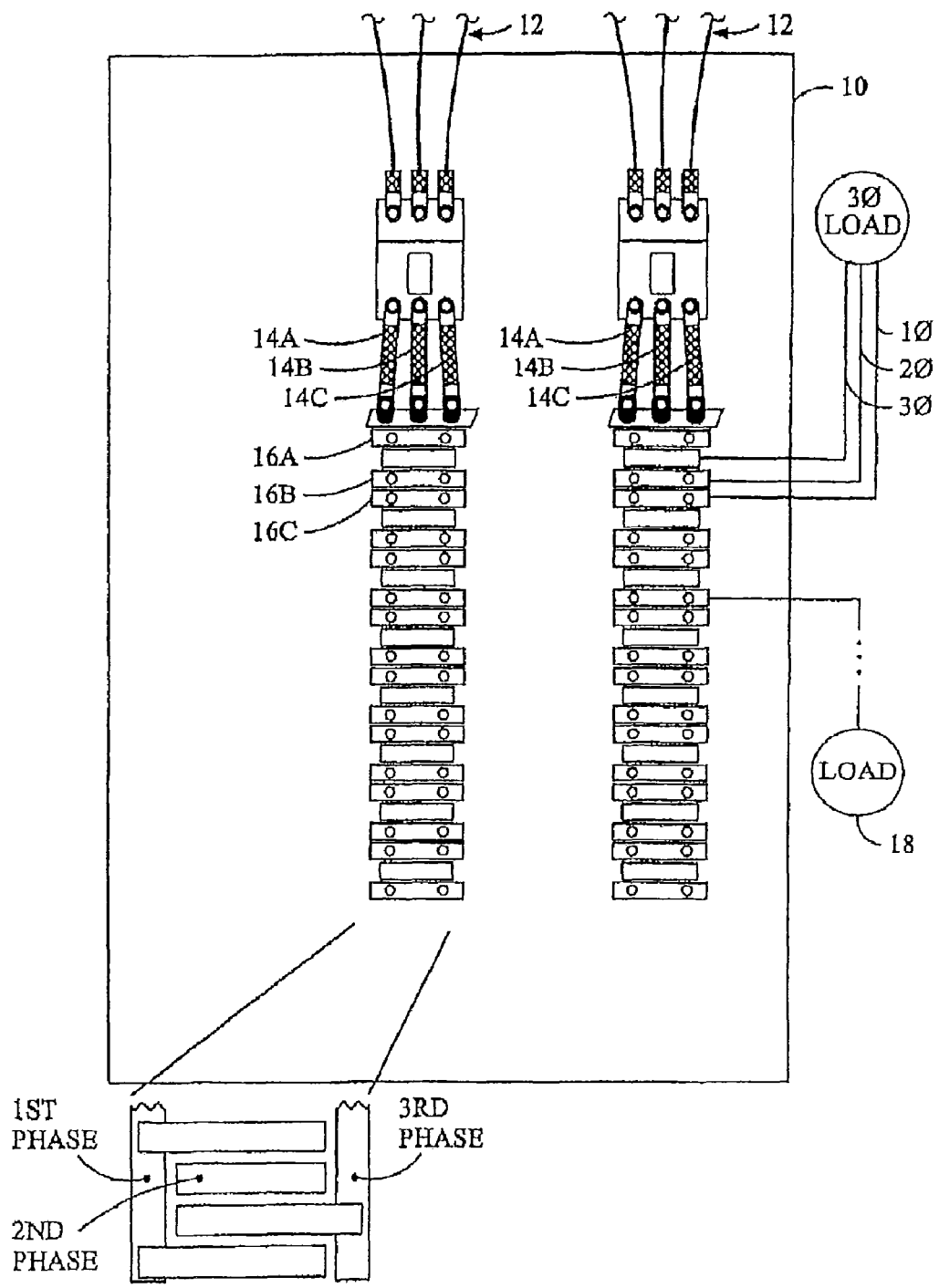
FIG. 1 illustrates a power panel with circuit breakers.
Figure 2:
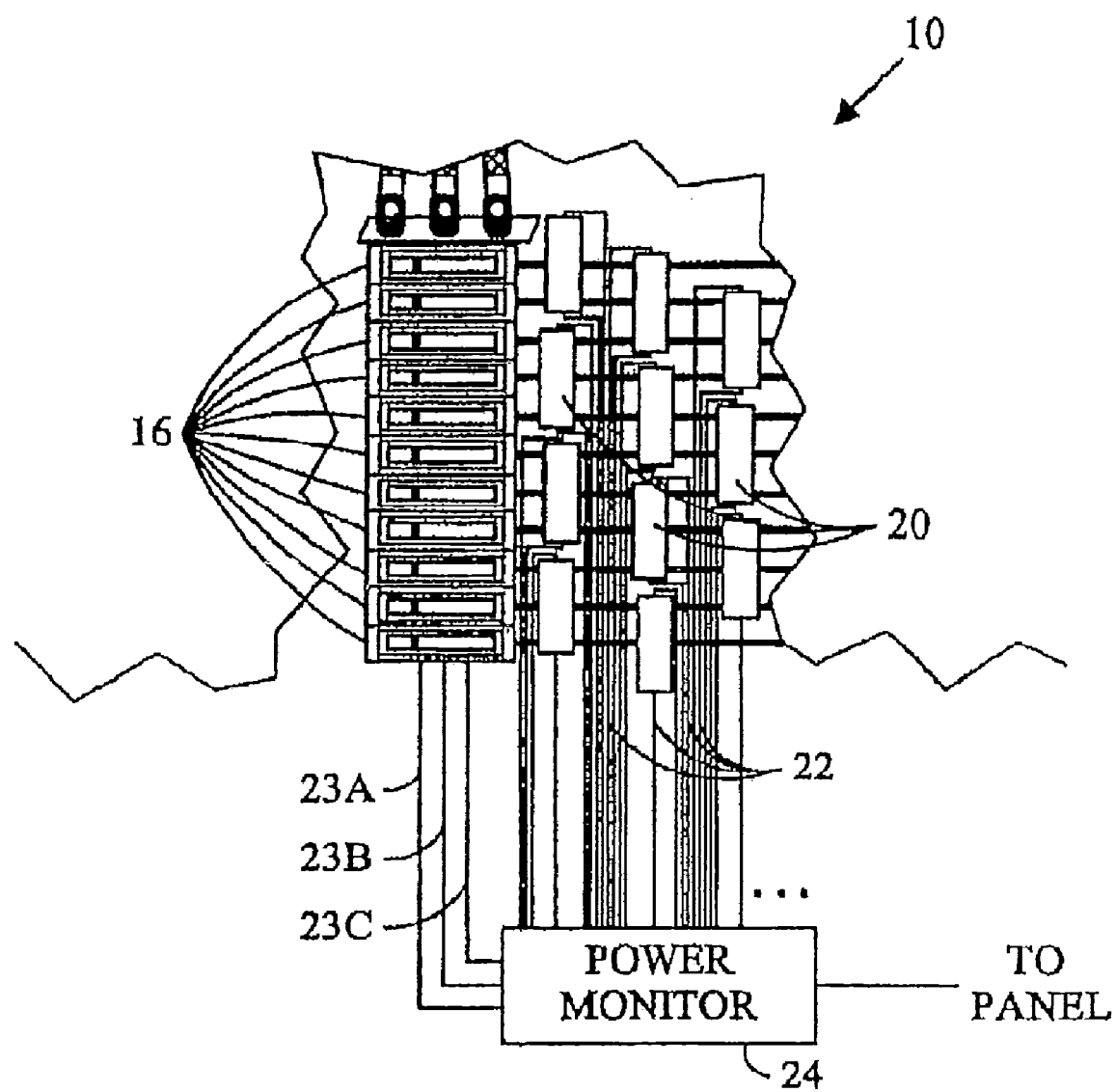
FIG. 2 illustrates circuit breakers, associated sensors, and a power monitor.
Figure 3:
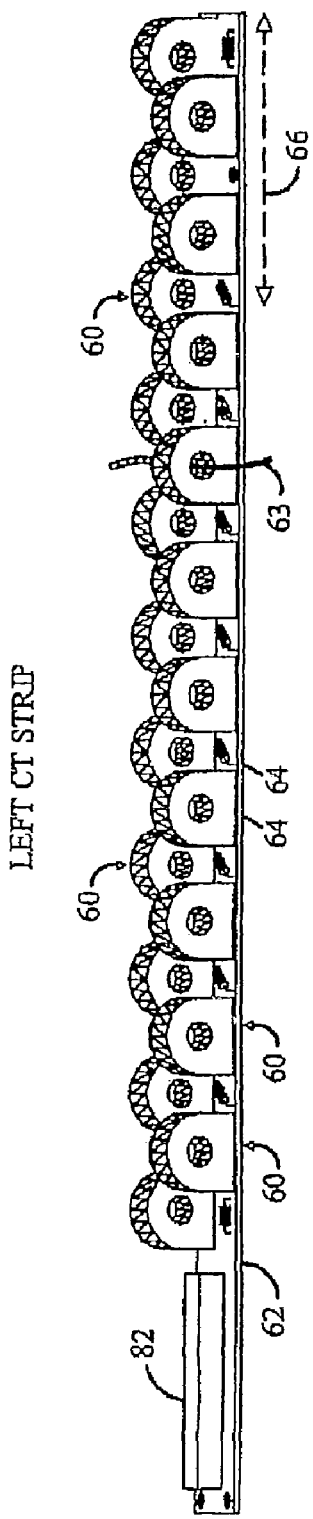
FIG. 3 illustrates a perspective view of a support for a set of current sensors.
Figure 4:
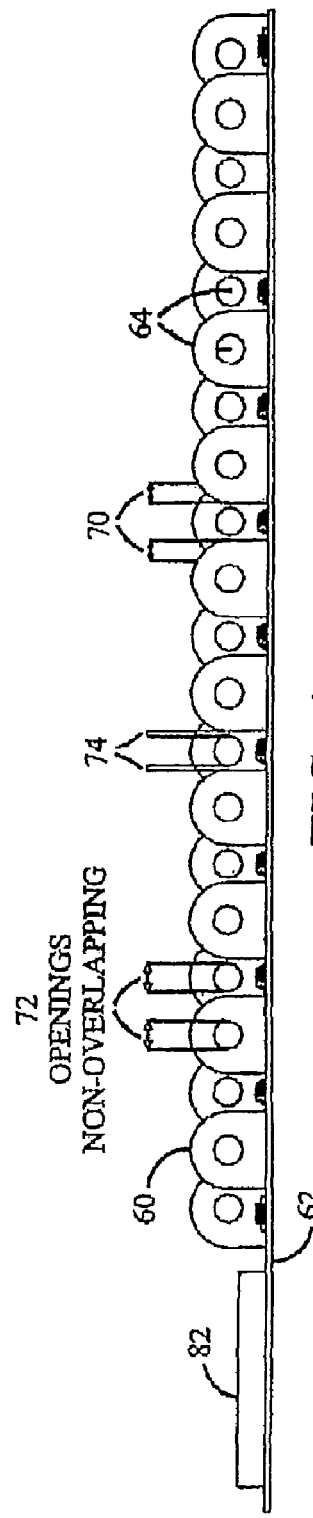
FIG. 4 illustrates a side view of the support and sensors of FIG. 3.
Figure 5:
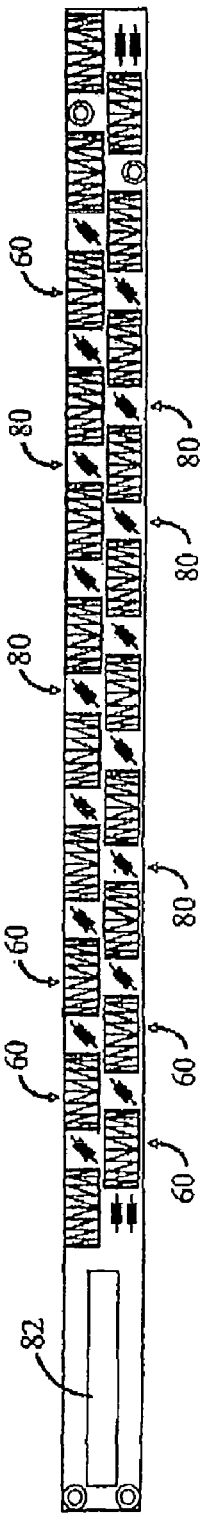
FIG. 5 illustrates a top view of the support and sensors of FIG. 3.
Figure 6:
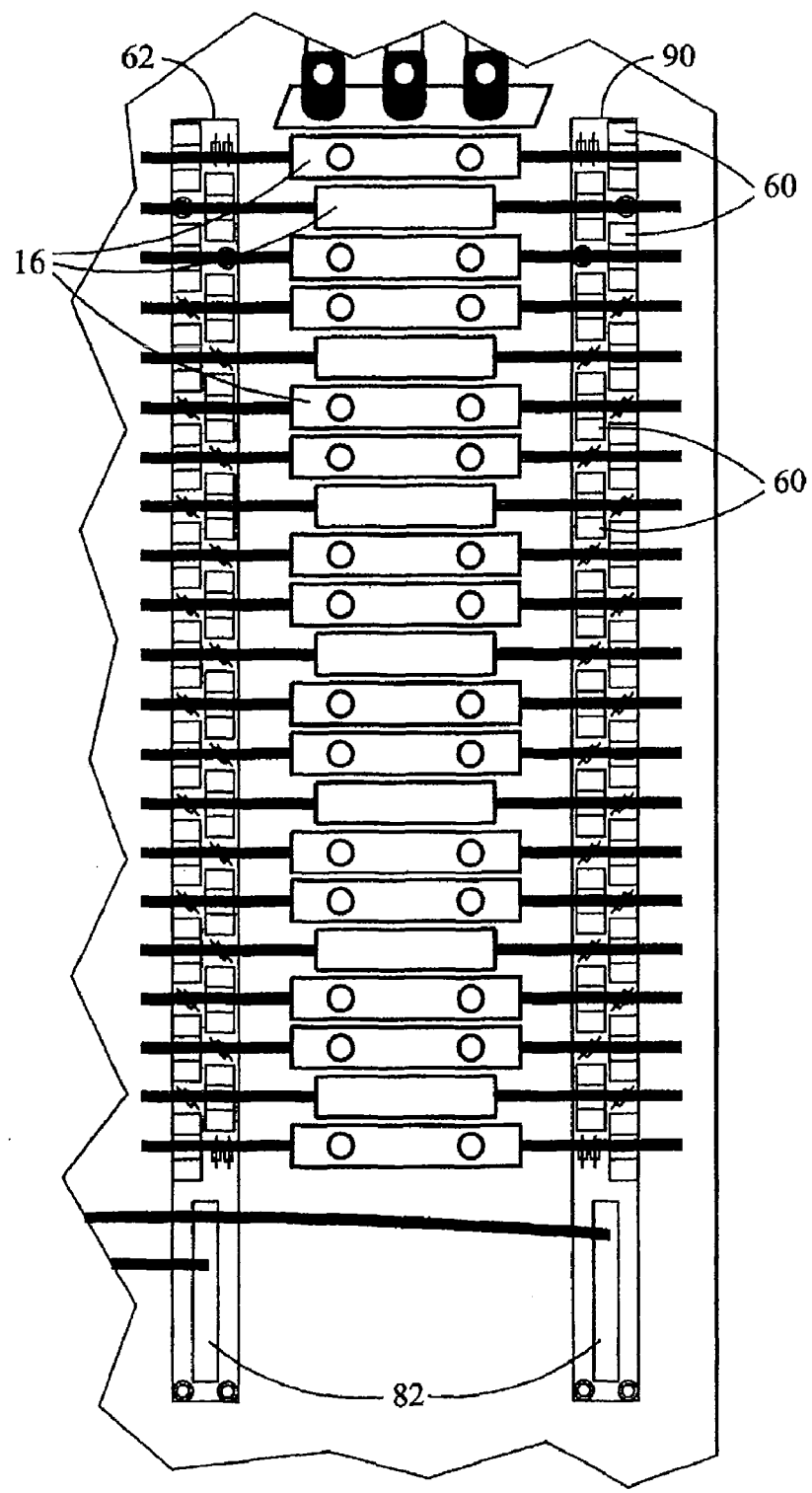
FIG. 6 illustrates a top view of the support and sensors of FIG. 2 together with circuit breakers.
Figure 7:
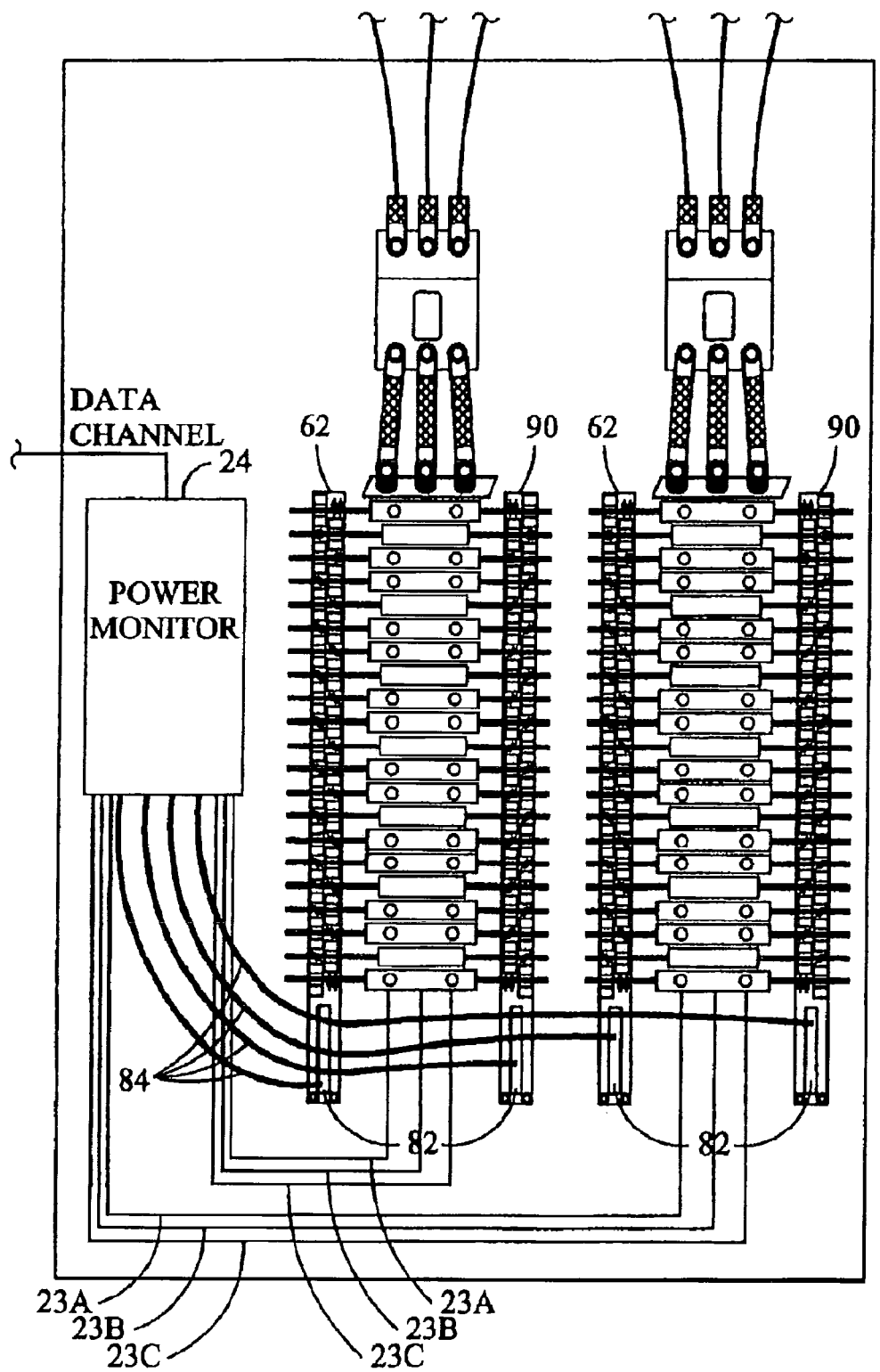
FIG. 7 illustrates a power panel assembly with a power monitor and the support/current sensors of FIG. 3.
Figure 8:
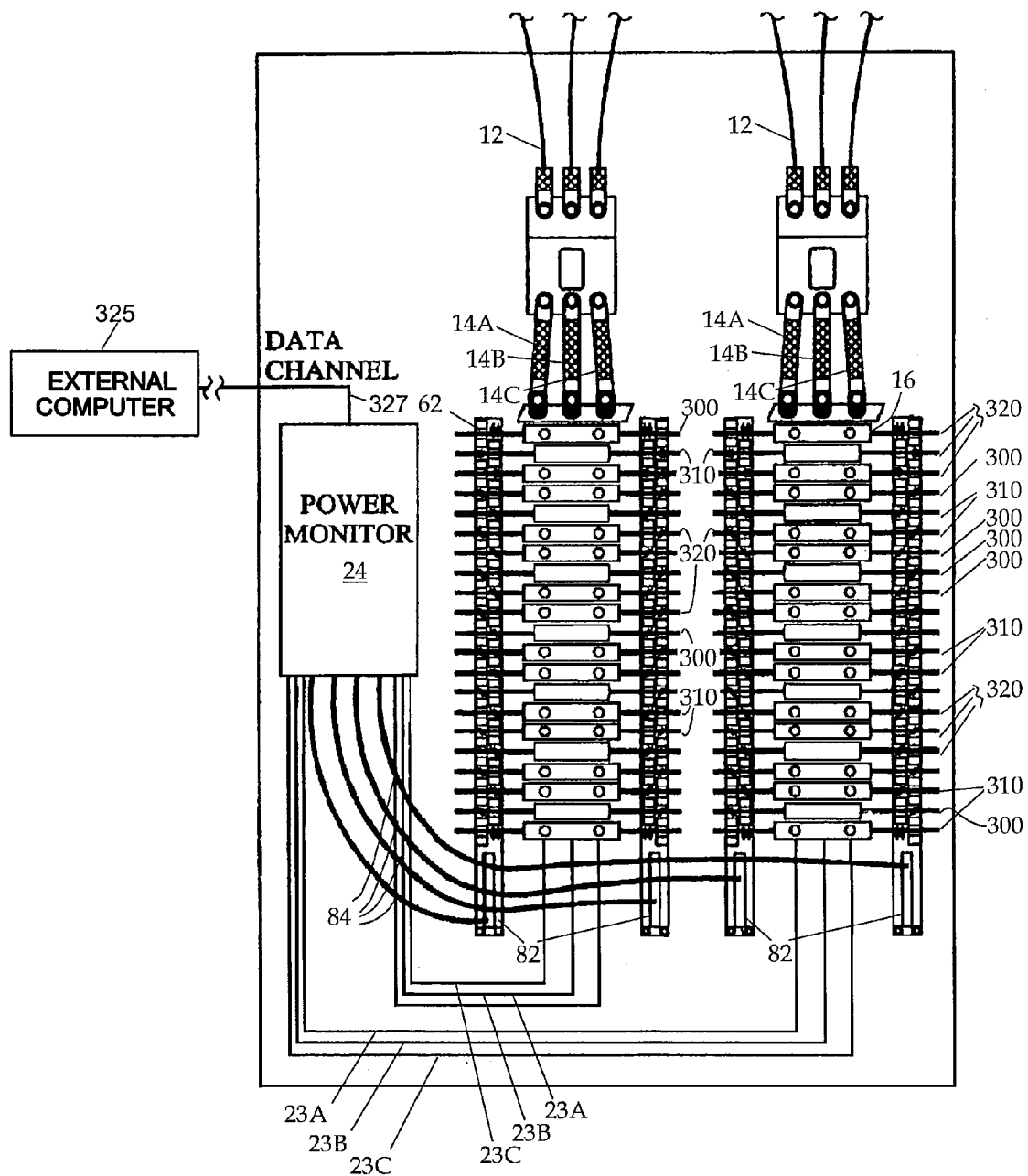
FIG. 8 illustrates a power monitoring system.

Referring to FIG. 8, a panel may include a mixture of single phase circuits 300, two phase circuits 310, and three phase circuits 320. In some cases, the two phase circuits 310 are not necessarily adjacent current transformers, and similarly the three phase circuits 320 are not necessarily adjacent current transformers. In some cases, it is not necessary to measure the output of each of the current transformers because the power usage of a particular current transformer is of no particular interest. Thus, the bandwidth limitations and computational complexity may be reduced by selectively not measuring selected current transformers.

However, for a flexible system it was determined that it is desirable to measure the current from all of the current transformers. At a minimum, if not determining the power from all of the current transformers, then obtain the necessary data from current transformers for which power determinations are not needed. Thus, on a regular basis, the system should sense the current from each of the current transformers including one or more that is not necessary for subsequent power determinations together with corresponding voltage measurements. Based upon this measurement of data, the power meter calculates the power usage for each of the sensed current transformers.

Figure 9:
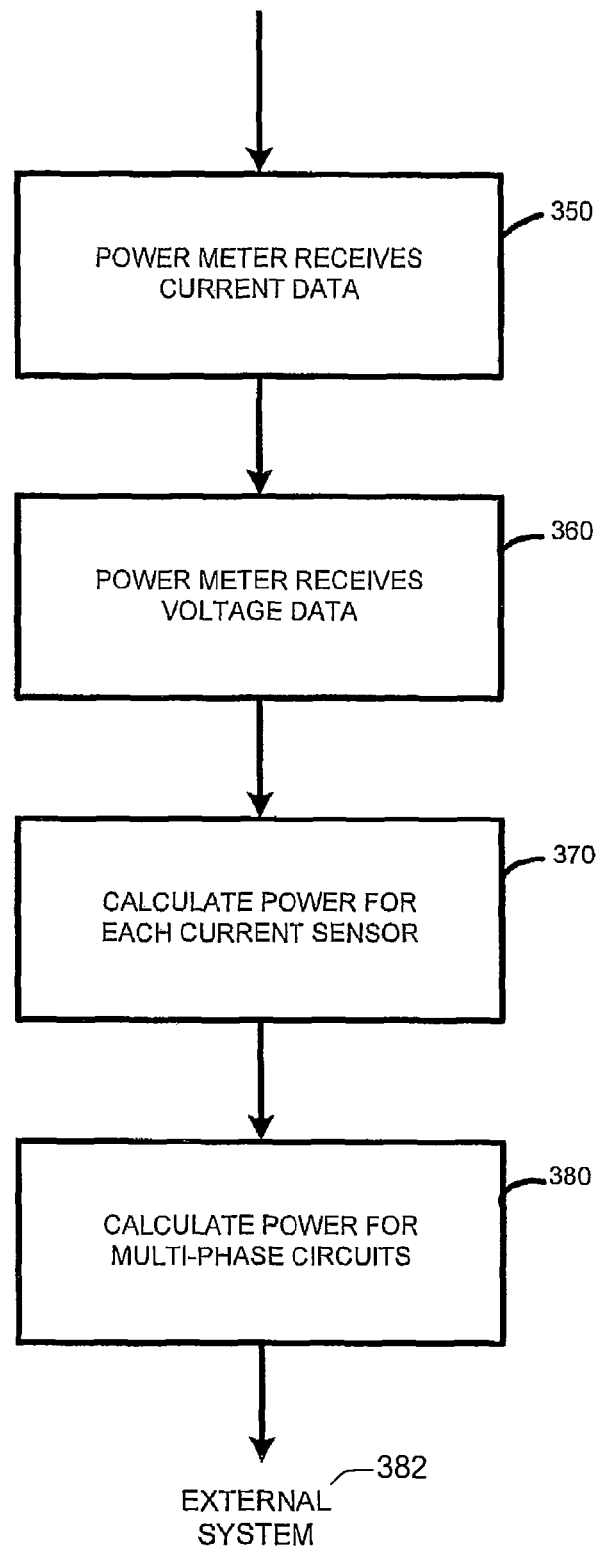
FIG. 9 illustrates a method of monitoring power with the power monitoring system of FIG. 8.

Referring to FIG. 9, for each of the current transformers, including at least one current transformer for which a power measurement is not needed, the current measurements are received by the power meter 350. In addition, the voltage is sensed for each of current transformers, typically a three phase voltage measurement 360. The power meter is contained within the power panel for power calculation. The power meter then calculates the power 370 for each of the sensed current transformers by multiplication of the current times the voltage. For single phase circuits the power meter has thus determined the power usage. For multi-phase circuits, a set of preferences determines which single phase power determines should be subsequently combined to calculate the multi-phase power 380. The system may account for a power factor, as desired. The system may calculate the power for particular multi-phase circuits without separately calculating the corresponding single phase circuits. The resulting power determinations are then provided 382 to an external computer system or power management system 325 via data channel 327. In some cases, it is desirable by default to calculate one phase power that is subsequently not used by the external computer system or power management system. In this manner, the configuration of the power meter is simplified. The process of sensing and calculating is done on an ongoing basis. In some cases, the data is obtained from the voltage sensors and current sensors in a parallel fashion or a serial sampling fashion.

In an alternative embodiment the power factor, the voltage potential, and/or the current may be calculated, sensed, or otherwise measured for a single phase of a multi-phase load. The power monitor may then use the voltage potential and current, together with the power factor if desired, to calculate the power usage of a multi-phase load by presuming that the remaining phases have similar characteristics. For example, in a three phase system the remaining phases may be presumed to have approximately a 60 degree phase difference. Reusing power calculations for other phases reduces the computation complexity of the power monitor while maintaining relatively accurate power measurements.

In an alternative embodiment, the power factor of a multi-phase load may be determined based upon one of the voltages and one of the currents, both of which are preferably associated with the same phase. The power factor may then be used for all of the phases, if desired. Reusing the calculated power factor reduces the computational complexity of the power monitor while maintaining relatively accurate power measurements.

In an alternative embodiment, the power monitor may, if desired, separate multiple summed alternating voltage signals into their respective phases for power determination, typically by decomposition of the composite signal.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

The invention claimed is:

1. A monitoring system within a power panel comprising:
    (a) a support supporting at least four current transformers thereon located within said power panel;
    (b) each of said current transformers providing an output;
    (c) a connection electrically interconnected to a conductor within said power panel having an associated voltage of at least one of said at least four current transformers;
    (d) a power monitor located within said power panel that is electrically interconnected by a flexible interconnection to said support which receives said output;
    (e) said power monitor electrically interconnected to said connection to receive a signal representative of said associated voltage;
    (f) said power monitor calculates the power associated with at least a respective one of said current transformers based upon said respective output and said associated voltage and subsequently provides said calculated power to an external device; and
    (g) wherein said power monitor calculates power associated with at least one other of said four current transformers that is not subsequently provided to the external device from said power monitor.

2. The monitoring system of claim 1 wherein said connection is a cable.

3. The monitoring system of claim 1 wherein said flexible interconnection includes a connector.

4. The monitoring system of claim 1 wherein said power monitor calculates two phase power associated with said at least four current transformers.

5. The monitoring system of claim 1 wherein said power monitor calculates three phase power associated with said at least four current transformers.

6. The monitoring system of claim 1 wherein said power monitor calculates at least two of single phase power, two phase power, and three phase power associated with said at least four current transformers.

* * * * *

UNITED STATES PATENT AND TRADEMARK OFFICE
CERTIFICATE OF CORRECTION

| | | |
|---|---|---|
| PATENT NO. | : 8,294,453 B2 | Page 1 of 1 |
| APPLICATION NO. | : 12/768875 | |
| DATED | : October 23, 2012 | |
| INVENTOR(S) | : Marc Bowman | |

It is certified that error appears in the above-identified patent and that said Letters Patent is hereby corrected as shown below:

Col. 5, Line 59

Change "determines" to --determinations--.

Signed and Sealed this
First Day of January, 2013

David J. Kappos
*Director of the United States Patent and Trademark Office*